June 25, 1968 J. DE MARIA ET AL 3,389,477

PRINTING PLATE ALIGNMENT DEVICE

Filed Sept. 24, 1965 2 Sheets-Sheet 1

INVENTORS
JOHN DE MARIA
HARLAN A. BENTZINGER
BY Richard P. Crowley
ATTORNEY

PRINTING PLATE ALIGNMENT DEVICE

Filed Sept. 24, 1965 2 Sheets-Sheet 2

INVENTORS
JOHN DE MARIA
HARLAN A. BENTZINGER
BY Richard P. [signature]
ATTORNEY

United States Patent Office 3,389,477

Patented June 25, 1968

3,389,477

PRINTING PLATE ALIGNMENT DEVICE

John De Maria and Harlan A. Bentzinger, Rehoboth, Mass., assignors to Chemical Products Corporation, East Providence, R.I., a corporation of Rhode Island Filed Sept. 24, 1965, Ser. No. 489,962
6 Claims. (Cl. 33—184.5)

ABSTRACT OF THE DISCLOSURE

A plate aligning device for precisely positioning printing plates on a carrier sheet. The device comprises a transport frame having reference lines scribed on its surface, and feet for supporting the frame adjustably secured thereto. Resiliently mounted in the center of the frame is a rectangular plate having a sealing gasket about its periphery adapted to form a vacuum chamber when engaged with the printing plate. In operation, the plate is aligned with and secured to the frame. The frame is then aligned with the carrier sheet, thereby aligning the plate with the carrier sheet. After alignment, the plate is then released from the frame and secured to the carrier sheet.

Our invention concerns a method of and an apparatus for rapidly and accurately positioning printing plates on a carrier sheet. In particular our invention relates to a means to align the edges of the printed characters on a printing plate with the reference lines of a key sheet, and to mount the printing plates on a carrier sheet with enhanced rapidity and accuracy.

The purpose of our invention is to provide means to align and to mount printing plates on a carrier sheet with the plates aligned with respect to each other and in a defined, accurate predetermined position on the carrier sheet. In a typical flat press printing operation a key sheet is normally prepared, which sheet has ruled reference lines to accurately define the final desired location of the printed matter. The key sheet is accurately drawn with reference lines which indicate where the margins and printing area of the printed matter on each respective printing plate should appear. The off-press mounting of printing plates either of a metal or plastic, flexible or rigid variety, is normally accomplished by placing a transparent carrier sheet over the key sheet. The carrier sheet may comprise, for example, a flexible, transparent plastic such as a thin polyester film sheet. Printing plates such as flexible plastic printing plates are then aligned on each side of the carrier sheet in a head-to-foot alignment and secured to the carrier sheet prior to being employed in the printing operation, e.g., the carrier sheet may comprise 64 plates on each sheet side. The plates must be aligned on each side and with respect to each other, so that when the printed sheet from the flat-bed press is folded, cut and trimmed the distance from the edge of each page to the printing matter (the page margins) or from the center out or any other reference system used should be substantially the same for all pages.

One method presently employed to prepare carrier sheets having a plurality of printing plates thereon is to secure the plates to the vacuum base of a flat-bed printing press in an approximate position. A printed sheet is then obtained from the press and ruled reference lines drawn with the line of best fit used to adjust the plates which do not fit this line. This method of best fit does save the work of moving all the plates to a predrawn reference line, since only the plates that don't conform to the best fitted line are moved. However, this method does have disadvantages in that allowance must be made for sufficient page area to cover any errors and corrections, and the second or perfecting side of the carrier sheet must be made up to the first or best fitted side. Quite often the line of best fit is not the best reference line to use.

Other means to obtain an accurate alignment of the printed matter on a carrier sheet have embraced the use of mechanical stops against which the marginal edge of the characters in the printing plates is pushed. However, the distance from the edge of the plate to the first printing character is often quite short and the characters may and often have tapered sides and are not the same distance from the edge. Further, the characters of the printing plate are often not always where they are desired on the plate. For example, paragraphs, capital letters, indents and the like vary from page to page while the mechanical stop can only usually be uniformly applied in the same area or same line.

The alignment of printing plates on a carrier sheet by eye without the use of mechanical stops or running off a sample printed sheet is not accurate enough, and, therefore, there exists the need for a means to rapidly and accurately line up the printed matter on a series of printing plates in a pre-determined position on a carrier sheet. It should be mentioned that the merely lining up of the edge of the printing plate is not feasible, since the distance from the plate edge to the printing character usually varies from plate to plate and such a method would seriously effect the accuracy of the positioning on a carrier sheet. For acceptable accuracy the printing surface and printing characters must be aligned on the carrier sheet.

It is, therefore, an object of our invention to provide means to align, in an accurate and rapid manner not hitherto possible, printing plates on a carrier sheet. Another object of our invention is to provide a means to align and to mount printing plates on a carrier sheet with respect to each other and in a defined, predetermined position with the edge of the printing characters of the printing plates being in substantial accurate alignment. A further object of our invention is to provide an apparatus for and a method of accurately aligning and mounting plastic printing plates on a flat carrier sheet to include alignment of the printing plate with our plate alignment device, removal of the aligned printing plate, the preparation of the printing plates for securement to the carrier sheet, and the alignment and mounting of the printing plate on the carrier sheet in a reference position.

Other objects and advantages of our invention will be apparent to those persons skilled in the art from the accompanying drawings and following description of our invention as follows.

Figures 1, 2, 3:
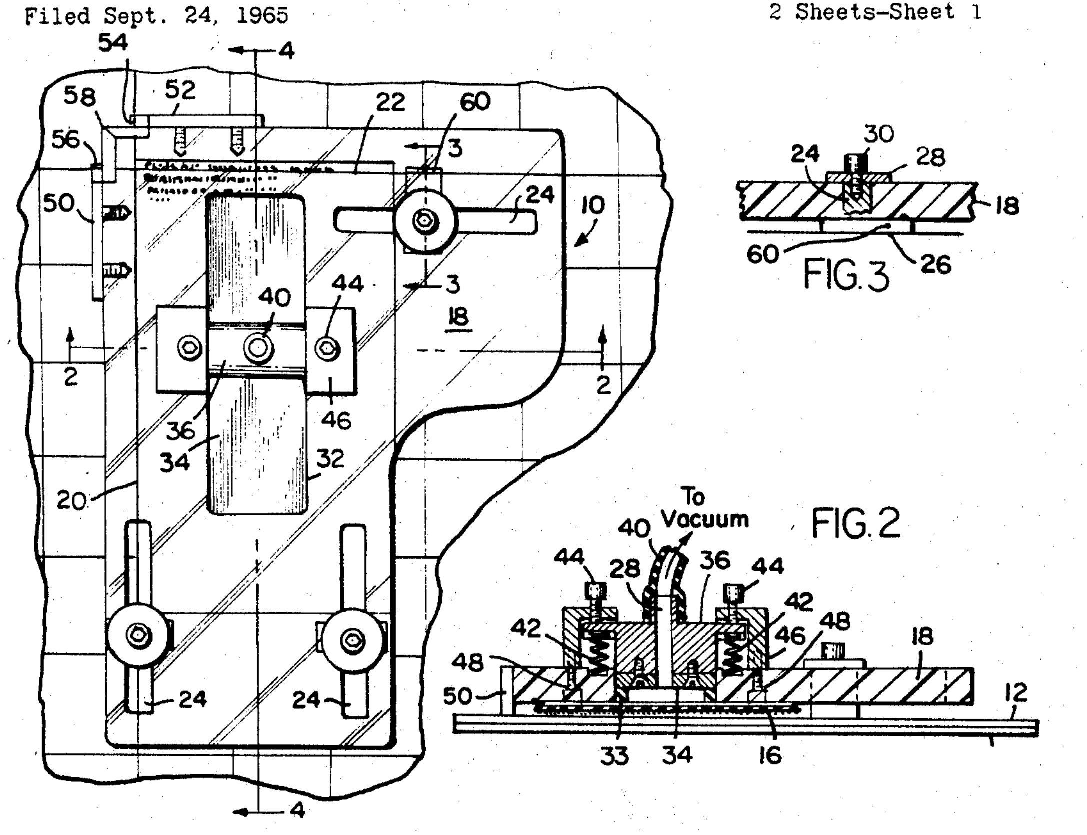
FIG. 1 is a top plan view of one embodiment of a plate aligning device of our invention, the device in an alignment position over a printing plate on a transparent carrier sheet over a ruled key sheet.
FIG. 2 is a sectional view of our plate alignment device of FIG. 1 through lines 2—2.
FIG. 3 is a fractional and sectional view of our plate alignment device of FIG. 1 through lines 3—3.
Figure 4:
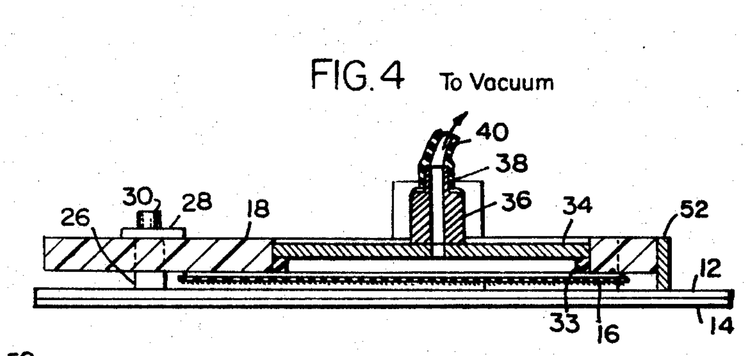
FIG. 4 is a sectional view of our plate alignment device of FIG. 1 through lines 4—4.
Figure 5:
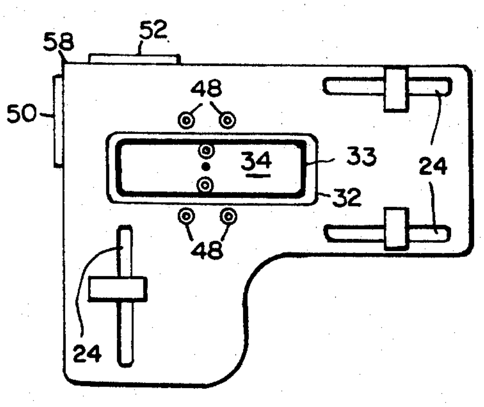
FIG. 5 is a bottom plan view of the plate alignment device of FIG. 1 without the key sheet, carrier sheet and printing plate.
Figure 6:
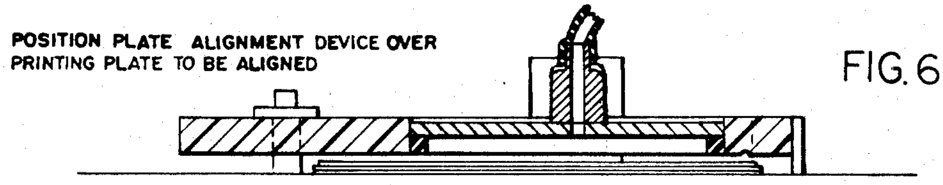
FIGS. 6–9 illustrate the method of employing the plate alignment device of our invention showing the sequence of steps in aligning a printing plate on a carrier sheet.
Figure 7:
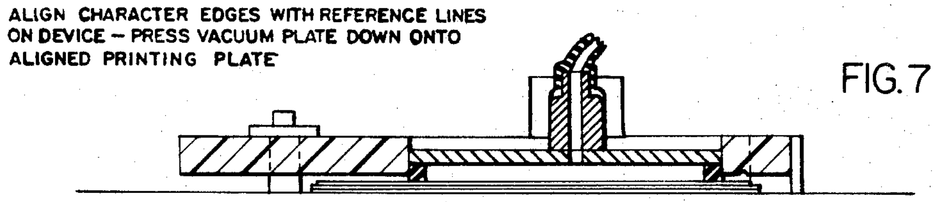
Figure 8:
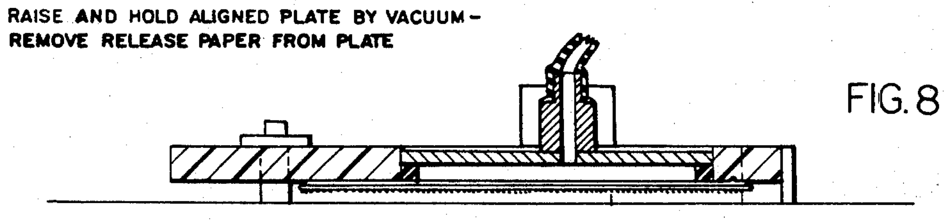
Figure 9:
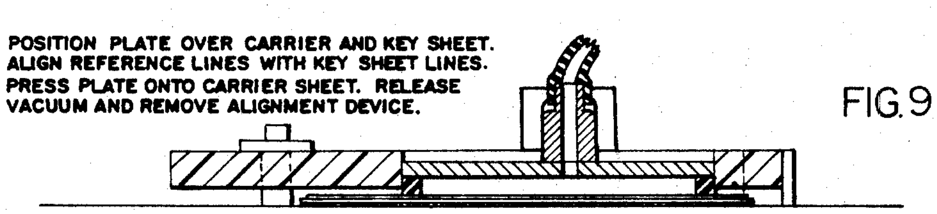
Figure 10:
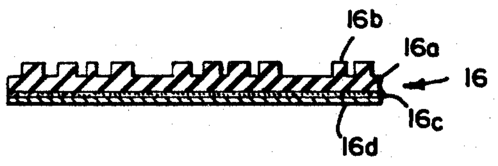
FIG. 10 is an enlarged cross-sectional view of a plastic printing plate of a type which may be employed with our plate alignment device.

FIGS. 1–5 show our plate aligning device 10 mounted on and over a ruled key sheet 14, a transparent plastic carrier sheet 12 and a printing plate 16 which is desired to be aligned and mounted onto the carrier sheet 12. The plate aligning device 10 illustrated is fabricated from a transparent, flat sheet of solid acrylic plastic which forms a transparent frame element 18. The frame element 18 is characterized by two accurately ruled, straight reference lines 20 and 22 scribed on the lower surface of the element 18 but clearly visible when viewed from above. The plate alignment lines 20 and 22 are at right angles to each other and extend to the outer edges of the frame and beyond the area of the plate 16. Element 18 is also characterized by three elongated, slotted openings 24 placed near the outer edges of the frame 18. Raised feet means are adjustable along the elongated slots to permit the use of the device with printing plates of varying thickness and area. The feet are fabricated to raise the lower surface of the frame element above the thickness of the printing plate which is to be aligned. Preferably the flat, lower feet surfaces are smooth and adapted to be easily slid over the flat surface of the carrier sheet 12, so that the device 10 may be adjusted over the printing plate 16 to the desired position without disturbing the plate 16. FIG. 3 shows the adjustable feet as comprising a T-shaped foot element 26, an upper washer element 28, and a threaded bolt element securing the washer to the element 26 and retaining the foot element 26 in the desired position and height in the respective slot.

Frame element 18 is also characterized by a rectangular opening 32 fairly centrally located so as to be disposed above the printing plate 16 to be aligned. This opening 32 permits the insertion of a vacuum holding means for the printing plate 16, which means serves to retain the printing plate 16 to the frame after initial alignment so that the release sheet may be removed. The vacuum holding means comprises a flat, rectangular plate element 34 spring mounted for reciprocating, vertical movement in a slidable manner in slot 32. The plate element 34 contains on its lower face and around the entire outer periphery thereof a downwardly projecting thin strip of resilient or sponge-like sealing or gasket material 33. The sealing gasket 33 is fabricated and mounted so that the interior of the plate element 34 when pushed against the printing plate surface forms an air-sealing or vacuum-holding chamber against the printing plate surface. A T-shaped body element 36 is secured to the plate 34 and contains an orifice which extends through and into the chamber formed by the plate element 34 and the sealing gasket 33. An upper nipple 38 and a flexible connecting hose 40 connects the orifice and chamber to a vacuum source (not shown). This provides a means of creating a vacuum in the chamber and thus a vacuum-holding force against the flat printing plate when the vacuum-holding means is depressed and placed into intimate sealing contact with the printing plate surface. A pair of housing elements 46 on either side of the cavity 32 secured to the frame 18 by bolts 48 includes spring retaining bolts 44 and springs 42 to provide means for tensionally retaining the plate element 34 and the peripheral sealing gasket 33 away from the printing plate over which the device 10 is mounted until the plate element 34 or body element 36 is depressed downwardly. The lower edge of the sealing gasket 33 is so arranged to be tensionally retained in line with or slightly above the lower plane surface of the frame element 18 when in a non-vacuum-holding position. Control of the vacuum in the chamber is conveniently accomplished by the operator manually squeezing together in closing engagement the resilient tube 40 leading to the vacuum source, although tubing clamps, valves or other means may also be employed for this purpose.

The upper left-hand portion of the device 10 includes two plate leg elements 50 and 52 secured onto the frame element 18, which elements extend below the bottom surface of the frame sufficiently to permit the frame element to be slid over the printing plate. The end portion of each leg element 50 and 52 nearest the left-hand corner of the device 10 contains a downwardly extending, straight reference line 54 and 56 scribed in that portion of the leg element which extends below the lower surface of the frame element. The reference lines 54 and 56 are extensions of and accurately aligned with the previous reference lines 20 and 22 on the lower surface of the frame element 18. However, these reference lines extend directly down to the surface of the carrier sheet on which the device 10 is placed, and thereby permit accurate registration and positioning of the device with a reduction in any parallax error. The upper left portion of the frame 18 has the corner 58 thereof cut away and sloped to provide the user with a sharp corner reference point easily observable from above. Also to aid registration, the foot element 26 within slot 22 and which extends below the reference line 22 is tapered and has a reference mark scribed thereon so that the reference mark also extends down to the top surface of the carrier sheet. This reference mark 60 is merely an extension of the reference mark 22, and helps the user in avoiding a parallax error when aligning the device.

With the aid of our device 10 printing plates 16 may be accurately and rapidly positioned on a carrier sheet by visual observation alone. However, where increased accuracy is desirable, means to aid the accurate registration and alignment of the reference lines of the device 10 with the reference lines of the key sheet 14 may be used. Such means include a magnifying glass operated manually or mounted on the frame 18 of the device 10 so as to provide an enlargement of the two reference lines and the underlying printing characters of the printing plate, thereby permitting more accurate alignment. As thus described, our device comprises a frame element, together with at least one reference line on the frame element for aligning the printing characters of an underlying printing plate in alignment with the reference line, means to lift the frame element above the height of the printing plate so that it may be slidably adjustable over the printing plate, and means to retain the printing plate once aligned to the frame element.

The operation of our device will be described in connection with the alignment and mounting of a plastic printing plate 16 which comprises a printing plate body **16*a*, printing characters 16*b* on the surface thereof, a thin adhesive backing or coating on the bottom of the printing plate 16*c*, and a release sheet secured to the adhesive backing 16*d* and removable therefrom. The device 10 should first have the feet elements 26 adjusted so that the printing plates to be aligned and mounted will fall within the outline made by the feet 26, and feet height adjusted so that the device is raised above the thickness of the printing plate whereby the device may be easily moved above the plate and placed in an alignment position. The device 10 shown and described is a right and left plate alignment device which can be used to align a wider range of plate sizes than a single plate alignment device, but requires a right and left margin to align all the pages of a form. Prior to employing our device the pressroom personnel must have the necessary information as to the top margin and edge margin to establish where the printing matter is to appear. An accurately drawn key sheet is then prepared employing the existing skills of the pressroom personnel. The key sheet 14 should be accurately drawn with reference lines to indicate where the printing matter is to appear, particularly where the edges of the printing matter will appear. The key sheet 14 is then placed on a flat surface such as a table which is well lighted, and a transparent flexible carrier sheet, such as a polyester film sheet 12, placed on top of this key sheet and the key sheet and carrier sheet aligned in some predetermined manner such as by aligning the margins or corners. The printing plate 16 with the release sheet 16*d* is then placed on the carrier sheet with the character letters 16*b*** face upward.

The plate alignment device 10 is then placed directly over the printing plate 16. The device 10 is raised higher than the printing plate over which it is placed to permit easier movement and adjustment of the device, and later movement of the device and the plate over the polyester carrier sheet. The reference lines 20, 22, 54, 56 and 58 on the device are then aligned by eye or by the aid of a magnifying means with both the top edge line and with the side edge line of the characters 16*b* on the printing plate. For most rapid operation the printing plate should be placed on the carrier sheet in the approximate position that the plate is to be mounted. When the printing plate has been so aligned with the reference marks on the plate alignment device 10, the vacuum-holding means is placed into firm contact with the printing plate by depressing element 36 so that the sealing gasket is pushed into firm contact with the surface of the plate 16.

The device is connected through a flexible tube 40 to a vacuum source, so that the depression of the plate element 34 and gasket 33 against the printing plate creates a vacuum-holding chamber and force on the printing plate. The vacuum means retains the aligned printing plate 16 in a predetermined position against the lower surface of the frame element 18 when the depressing force on the element 36 is released. The device 10 with the retained and aligned printing plate 16 is then picked up and the release sheet 16*d* removed. The device 10 and printing plate 16 is then again placed on the carrier sheet 12, and the registration lines on the device aligned with the correct lines on the underlying key sheet 12. For a rapid and proper registration and to avoid a parallax error, the reference marks close to the surface of the carrier sheet such as those reference marks on the lower portions of the feet elements, i.e., reference marks 54, 56 and 60 are used to adjust the position of the device accurately with the reference lines on the key sheet 14. When the device and printing plate have been accurately aligned again, the vacuum-holding means, i.e. plate 34 and body 36 is depressed to place the printing plate with the adhesive backing 16*c* in firm mounting contact with the surface of the carrier sheet 14 and in the correct aligned position. When the printing plate 16 adheres to the carrier sheet, the flexible tube 40 from the vacuum holder to the vacuum source is then pinched or the vacuum source otherwise shut off to remove the vacuum to the plate and release the holding force against the plate 16. This allows the vacuum means to be retracted by spring tension into its normal position within or aligned with the lower surface of the frame 18. This procedure is then repeated until all the printing plates have been mounted on the carrier sheet in rapid and accurate manner.

Although our device has been described with a particular embodiment, changes and alterations with the skilled scope of persons in the art are possible. For example, rather than reference lines placed at right angles to one another, a single reference line may be employed in some circumstances. Additionally, the use of other plate-holding or retaining means rather than the vacuum-holding means is possible, such as the use of adhesive or adhesive tape or other means to retain the aligned printing plate in one position with frame element 18 of the plate alignment device. The frame element has been described in its preferred embodiment as an entirely transparent element, containing reference lines. However, the reference lines need not be observable through the element, but may be even with the edge of an opaque frame element or even placed beyond the frame element. As described, our device permits the rapid and accurate positioning of plates on a carrier sheet in an off-press manner for a flat-bed printing process.

What we claim and desire to protect by Letters Patent is:

1. A printing plate alignment device to align and to mount printing plates in an accurate and rapid manner in a predetermined position on a carrier sheet, which device comprises in combination:

a frame element which includes at least one reference line, said line capable of being visually aligned with the line of printing characters of a printing plate beneath the frame element;

means to support the frame element slightly above the thickness of the printing plate which is to be aligned thereby permitting adjustment of the frame element to the aligned position; and vacuum holding means in the frame element in position above the printing plate to be aligned, the said holding means disposed for reciprocating vertical movement within the frame and above the printing plate to be aligned and capable of being placed in a vacuum sealing contact with the upper surface of the printing plate after alignment whereby the printing plate is retained with the frame element in a fixed position permitting the removal of a release sheet from the lower surafce of the plate and the realignment and mounting of the plate on the carrier sheet.

2. The device of claim 1 wherein the vacuum-holding means includes:

a spring loaded plate element containing a peripheral sealing gasket, the gasket substantially aligned with the lower surface of the frame element in its compressed position, the plate element containing an orifice in communication with a vacuum source, and the plate element disposed in an opening in the frame element above the plate to be aligned, with the plate element and gasket capable of forming a vacuum-holding chamber to retain the plate, when the plate and gasket is depressed into contact with the upper surface of the aligned plate.

3. A method of aligning and mounting a printing plate on a carrier sheet which method comprises:

aligning at least one edge line of the printing characters on a printing plate with a reference line on a plate aligning device mounted over the printing plate;

retaining the aligned printing plate to the lower surface of the plate alignment device in a fixed position;

placing the aligned printing plate in condition to be secured to a carrier sheet;

placing the aligned and conditioned printing plate and device on a transparent carrier sheet, which carrier sheet is laid over a key sheet having reference lines thereon;

aligning the reference line on the plate alignment device with a reference line on the key sheet; and releasing the printing plate from the lower surface of the device and securing the plate in the aligned position on the carrier sheet.

4. The method of claim 3 wherein the printing plate is characterized by an adhesive back-coating and a protective release sheet and placing the aligned printing plate in condition to be secured to a carrier sheet includes removal of the release sheet from the back of the printing plate.

5. A printing plate alignment device to align and to mount printing plates in an accurate and rapid manner in a predetermined position on a carrier sheet, which device comprises in combination:

a frame element which includes a transparent portion and a pair of straight reference lines at right angles to each other thereon, the lines a predetermined distance from the edge of the frame element whereby the reference lines may be aligned visually with the line of printing characters of a printing plate beneath the frame element;

means to support the frame element slightly above the thickness of the printing plate which is to be aligned thereby permitting adjustment of the frame element to the aligned position; and vacuum holding means in the frame element in position above the printing plate to be aligned, said holding means tensionally disposed for reciprocating movement within the frame element and above the printing plate surface whereby depressing the vacuum means into contact with the printing plate surface retains the plate with the frame element through a vacuum-holding force.

6. A printing plate alignment device to align and to mount printing plates in an accurate and rapid manner in a predetermined position on a carrier sheet, which device comprises in combination:

a frame element which includes a transparent portion and a pair of straight reference lines at right angles to each other thereon, the lines a predetermined distance from the edge of the frame element whereby the reference lines may be aligned visually with the line of printing characters of a printing plate beneath the frame element;

means to support the frame element above the thickness of the printing plate which means include feet elements having reference lines thereon, which lines are aligned with the reference lines of the frame element and extend downwardly toward the surface of the carrier sheet on which the printing plate is to be mounted;

vacuum holding means in a frame element in position above the printing plate to be aligned, the said holding means disposed for reciprocating vertical movement within the frame and above the printing plate to be aligned and capable of being placed in a vacuum sealing contact with the upper surface of the printing plate after alignment, whereby the printing plate is retained with the frame element in a fixed position permitting the removal of a release sheet from the lower surface of the plate and the realignment and mounting of the plate on the carrier sheet.

References Cited

UNITED STATES PATENTS

| | | | |
|---|---|---|---|
| 2,041,373 | 5/1936 | Saunders | 33—184.5 X |
| 2,115,357 | 4/1938 | Bancroft et al. | 33—184.5 |
| 2,131,323 | 9/1938 | Huebner | 33—184.5 X |
| 2,825,142 | 3/1958 | Johnson | 33—184.5 |
| 902,584 | 11/1908 | Huebner | 33—184.5 X |

SAMUEL S. MATTHEWS, *Primary Examiner.*